(12) United States Patent
Zhou et al.

(10) Patent No.: US 9,952,638 B2
(45) Date of Patent: Apr. 24, 2018

(54) REMEDIATION OF THERMAL IRREGULARITIES IN COMPUTING ENVIRONMENT

(71) Applicant: Intel Corporation, Santa Clara, CA (US)

(72) Inventors: Shaorong Zhou, Shanghai (CN); Hong W. Wong, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/119,017

(22) PCT Filed: Apr. 1, 2014

(86) PCT No.: PCT/CN2014/074523
§ 371 (c)(1),
(2) Date: Aug. 15, 2016

(87) PCT Pub. No.: WO2015/149272
PCT Pub. Date: Oct. 8, 2015

(65) Prior Publication Data
US 2016/0363970 A1 Dec. 15, 2016

(51) Int. Cl.
*G06F 1/20* (2006.01)
*H05K 7/20* (2006.01)

(52) U.S. Cl.
CPC ............ *G06F 1/203* (2013.01); *G06F 1/20* (2013.01); *H05K 7/20154* (2013.01); *H05K 7/20436* (2013.01)

(58) Field of Classification Search
CPC ....... G06F 1/203; G06F 1/20; H05K 7/20154; H05K 7/20436

(Continued)

(56) References Cited

U.S. PATENT DOCUMENTS 8,712,598 B2 * 4/2014 Dighde ............ H04M 1/72563
  361/688
8,804,331 B2 * 8/2014 Refai-Ahmed ..... H01L 23/3672
  165/104.33

(Continued)

FOREIGN PATENT DOCUMENTS

CN       2884810 Y     3/2007
CN     202310428 U     4/2012

(Continued)

OTHER PUBLICATIONS

English translation of the Zheyuan reference.*
International Search Report and Written Opinion in International Patent Application No. PCT/CN2014/074523 dated Dec. 30, 2014.

*Primary Examiner* — Dion R Ferguson
*Assistant Examiner* — Mandeep S Buttar
(74) *Attorney, Agent, or Firm* — Patent Capital Group

(57) ABSTRACT

In an example, a computing device is disclosed in which processing elements and other active devices may generate thermal irregularities such as hot spots on the casing of a computing device. In some cases, these hot spots may be undesirable from a comfort and usability standpoint or because they may result in thermal damage to system components. To remediate thermal irregularities, including hot spots, a localized depression may be provided in a casing or chassis to enlarge the air gap between the heat source and the bottom casing around the hot spot, so that the bottom casing skin temperature at the hot spot can be lowered with the increased air gap. A heat spreader may also be disposed above the localized depression to better distribute heat over a surface area. In some cases, ribbing may be provided to provide structural support to a heat spreader disposed over a localized depression.

18 Claims, 5 Drawing Sheets

(58) Field of Classification Search
USPC .................. 361/679.47; 257/712; 438/122
See application file for complete search history.

(56) References Cited

U.S. PATENT DOCUMENTS

| | | | | |
|---|---|---|---|---|
| 2001/0032720 | A1* | 10/2001 | Eesley | ............... F28F 3/02 |
| | | | | 165/185 |
| 2002/0157819 | A1* | 10/2002 | Norley | ............... B32B 9/00 |
| | | | | 165/185 |
| 2004/0159935 | A1* | 8/2004 | Ghosh | ............... H01L 23/34 |
| | | | | 257/712 |
| 2016/0223178 | A1* | 8/2016 | Toth | ............... F21V 29/70 |

FOREIGN PATENT DOCUMENTS

| | | |
|---|---|---|
| CN | 202841818 U | 3/2013 |
| CN | 202841819 U | 3/2013 |

* cited by examiner

"REMEDIATION OF THERMAL IRREGULARITIES IN COMPUTING ENVIRONMENT"

This application is a national stage application under 35 U.S.C. § 371 of PCT International Application Serial No. PCT/CN2014/074523, filed on Apr. 1, 2014 and entitled "REMEDIATION OF THERMAL IRREGULARITIES IN COMPUTING ENVIRONMENT", which application is considered part of and is hereby incorporated by reference in its entirely in the disclosure of this application.

FIELD OF THE DISCLOSURE

This application relates to the field of thermodynamics, and more particularly to a device and system for remediation of thermal irregularities in a computing environment.

BACKGROUND

Thermodynamics is a system-critical consideration in many computing devices. A common computing system includes a number of active components that generate substantial heat, including to some degree each of the many active devices within the computing system. Among the greatest concerns for heat dissipation are central processing units (CPUs) and graphics processing units (GPUs), which may include many millions or even billions of transistors. Other components may make lesser heat contributions to the thermal output of a computing system. A primary concern in the field of thermodynamic engineering for computing devices is transferring heat from these and other sensitive electronic components into a cooled ambient environment where it is less likely to cause damage.

BRIEF DESCRIPTION OF THE DRAWINGS

The present disclosure is best understood from the following detailed description when read with the accompanying FIGURES. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION OF THE EMBODIMENTS

Overview

Figure 1:
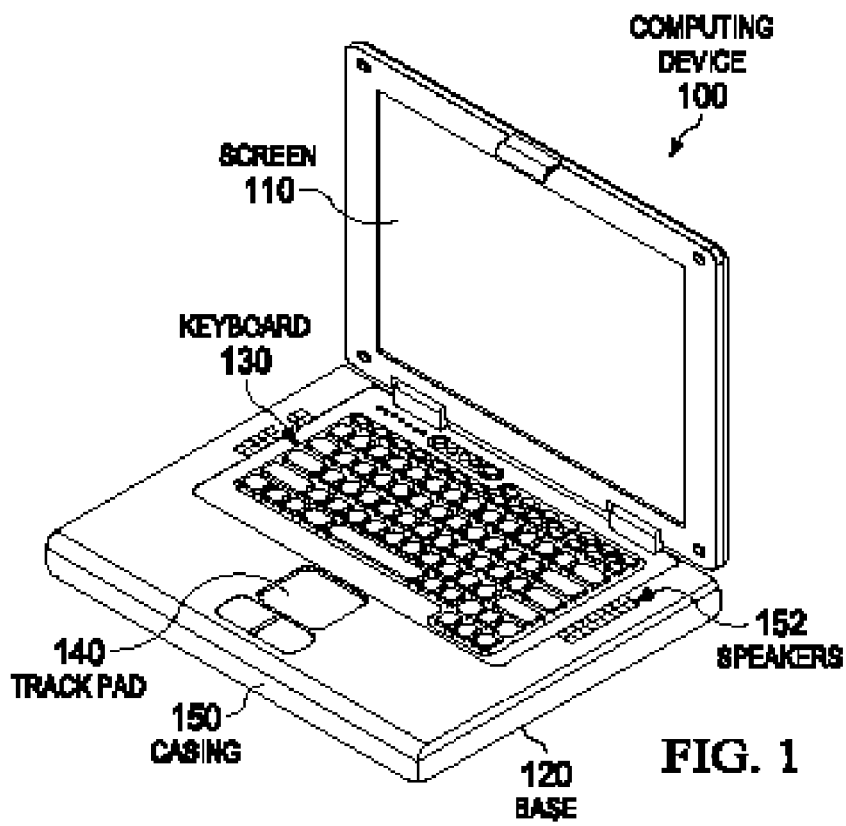
FIG. 1 is a perspective view of a computing device according to one or more examples of the present Specification.

In an example, a computing device is disclosed in which processing elements and other active devices may generate thermal irregularities, such as hot spots, on the casing of a computing device. In some cases, these hot spots may be undesirable from a comfort and usability standpoint or because they may result in thermal damage to system components. To remediate thermal irregularities, including hot spots, a localized depression may be provided in a casing or chassis to increase the air gap between the heat source and the bottom casing around the hot spot, so that the bottom casing skin temperature at the hot spot can be lowered with the increased air gap. A heat spreader may also be disposed above the localized depression to better distribute heat over a surface area. In some cases, ribbing may be provided to provide structural support to a heat spreader disposed over a localized depression.

Example Embodiments of the Disclosure

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples. This repetition is for the purpose of simplicity and clarity and does not in itself dictate a relationship between the various embodiments and/or configurations discussed.

Different embodiments may have different advantages, and no particular advantage is necessarily required of any embodiment.

In an example of the present Specification, a designer of a computing device may be concerned with identifying and remedying localized hot spots that may develop under operating conditions of the computing device. In one embodiment, a designer may build a prototype and use thermal imaging, temperature sensors, or other technologies to detect localized hot spots. The design may then be modified iteratively as necessary to prepare the computing device for a final production run with desired thermal properties. In some cases, a designer may also use computational fluid dynamics (CFD) principles to identify hot spots. Available tools for performing appropriate thermal simulation include, for example, commercial software such as Icepak, FlowTHERM, or similar.

After identifying localized hot spots on a chassis or casing, the system designer may modify the design to remedy the hot spot. Remediation for a hot spot may include, for example, adding a local depression to the casing or chassis beneath the hot spot. This increases the air gap and helps to lower the skin temperature at the casing hot spot. A heat spreader, for example a graphite sheet or metallic foil such as copper or other conductive metal, may also be used to distribute heat more evenly across the chassis.

FIG. 1 is a perspective view of a computing device 100 according to one or more examples of the present Specification. Computing device 100 in various embodiments may include or be part of, by way of non-limiting example, a computer, embedded computer, embedded controller, embedded sensor, personal digital assistant (PDA), laptop computer, cellular telephone, IP telephone, smart phone, tablet computer, handheld calculator, or any other electronic, microelectronic, or microelectromechanical device for processing and communicating data.

In the present example, computing device 100 includes screen 110, which may be a visual output device, and which in certain embodiments may also be a touch interface or other combined input/output device. Keyboard 130 may be disposed in a base 120 and is provided as an example of an input device, and may be any type of keyboard. A trackpad 140 may also be provided as an additional input device. Speakers 152 may provide output in coordination with screen 110.

A casing 150 may also be provided which provides a mechanical form factor and protective covering for computing device 100.

Figure 1A:
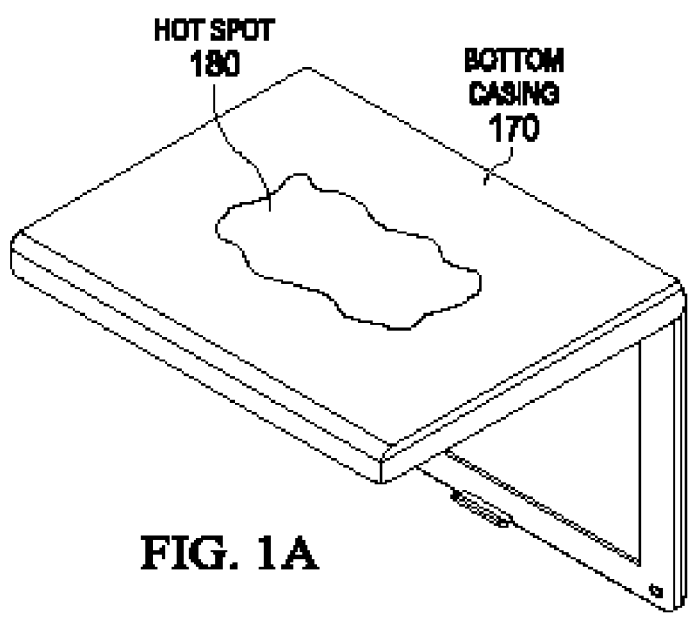
FIG. 1A is a bottom perspective view of the computing device of FIG. 1 according to one or more examples of the present Specification.

FIG. 1A is a bottom perspective view of computing device 100 according to one or more examples of the present Specification. As may be seen in FIG. 1A, computing device 100 includes a bottom casing 170 which forms a part of overall casing 150. One or more processing elements or other active devices may produce heat, and which may result in a localized hot spot 180 developing on bottom casing 170. It should be noted, however, that hot spot 180 need not necessarily be located on bottom casing 170. Rather, hot spot 180 on bottom casing 170 is provided by way of an example and to illustrate a common placement of a hot spot 180 in certain embodiments of the present Specification. It will be recognized that many other locations for a hot spot 180 may arise.

Figure 2:
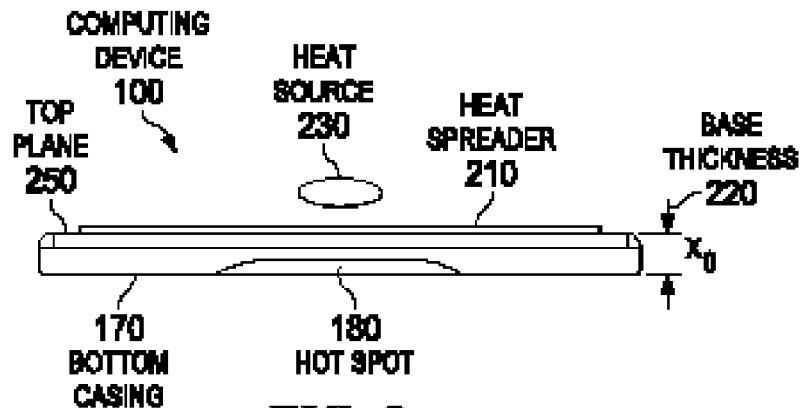
FIG. 2 is a cutaway side view of a computing device according to one or more examples of the present Specification.

FIG. 2 is a cutaway side view of computing device 100 according to one or more examples of the present Specification. This discloses with more particularity the structure of computing device 100 and how a localized hot spot 180 may develop. In this example, bottom casing 170 is visible. Bottom casing 170 may have a base thickness 220. Base thickness 220 may be a predominant, though not necessarily uniform thickness for bottom casing 220, referred to herein as $X_0$. In certain embodiments, base thickness 220 may be substantially uniform throughout bottom casing 170. However, this need not be the case. In certain embodiments, bottom casing 170 may have certain localized variations in thickness. In many cases, a top plane 250 of bottom casing 170 may be a substantially flat and uniform plane. Thus, in many embodiments, variations in base thickness 220 will be reflected in a bottom profile of bottom casing 170.

Heat source 230 may be located at some point above bottom casing 170. Heat source 230 may be any of the processing elements or other heat generating devices located within computing device 100 as described in more detail in connection with FIG. 8. For example, heat source 230 may be a processor, digital signal processor, or graphics processing unit. To minimize the intensity and impact of localized hot spot 180, a heat spreader 210 may be used. Heat spreader 210 may be a conductive surface, such as a conductive metal, and may form a relatively large two-dimensional plane across top plane 250 of bottom casing 170. Heat spreader 210 may be used to more evenly distribute heat across top plane 250, thus reducing the intensity of hot spot 180.

Figure 3:
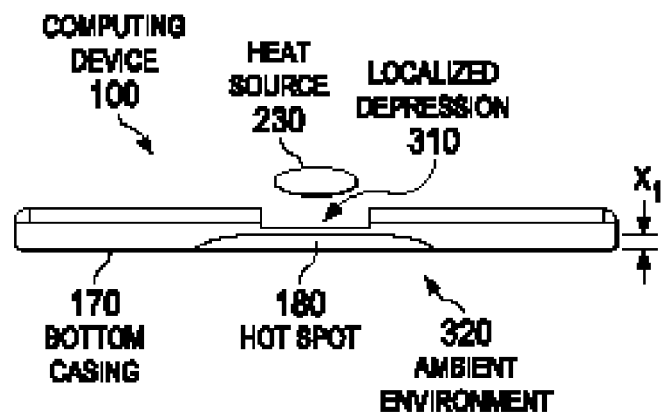
FIG. 3 is a cutaway side view of a computing device according to one or more examples of the present Specification.

FIG. 3 is a cutaway side view of computing device 100 according to one or more examples of the present Specification. In this example, a heat source 230 is again disclosed, creating a hot spot 180 on bottom casing 170.

In this embodiment, it is recognized that an increased air gap may be used to partially remedy hot spot 180. Thus, a localized depression 310 is disposed substantially beneath heat source 230 to help radiate out into ambient environment 320. Localized depression may have a thickness $X_1$ that is appreciably less than the predominant base thickness $X_0$ of bottom casing 170. Thus, according to this embodiment, the intensity and impact of hotspot 180 may be minimized.

Figure 4:
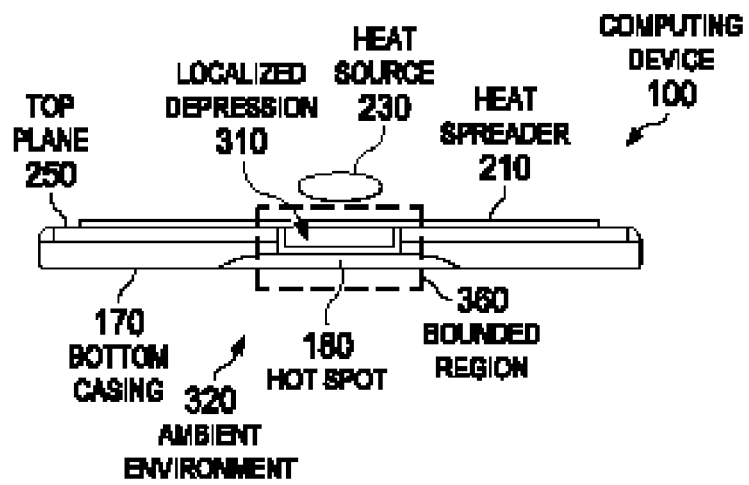
FIG. 4 is a cutaway side view of a computing device according to one or more examples of the present Specification.

FIG. 4 is a cutaway side view of computing device 100 according to one or more examples of the present Specification. FIG. 4 represents a combination of the embodiments of FIG. 2 and FIG. 3. In particular, FIG. 4 includes heat source 230 generating a hot spot 180 on bottom casing 170. To help alleviate the intensity and impact of hot spot 180, a localized depression 310 is provided with heat spreader 210 disposed substantially over and across localized depression 310. Thus, localized depression 310 is disposed to substantially distribute heat from heat source 210 across top plane 250 of bottom casing 170. However, it is recognized that heat spreader 210 may not be able to perfectly distribute heat from heat source 230 across top plane 250 of bottom casing 170. Thus, a relatively higher intensity hot spot 180 may still develop. Thus, localized depression 310 may be provided to help radiate heat outward into ambient environment 320.

In certain embodiments, heat spreader 210 may substantially obstruct or enclose localized depression 310, such that air inside of localized depression 310 may be substantially enclosed within a region bounded by heat spreader 210 and localized depression 310, referred to herein as bounded region 360. Note, however, that it is not intended that the bounded region need necessarily be airtight or a substantial vacuum. Rather, the region may be only loosely bound so as to substantially slow air flow.

Figure 5:
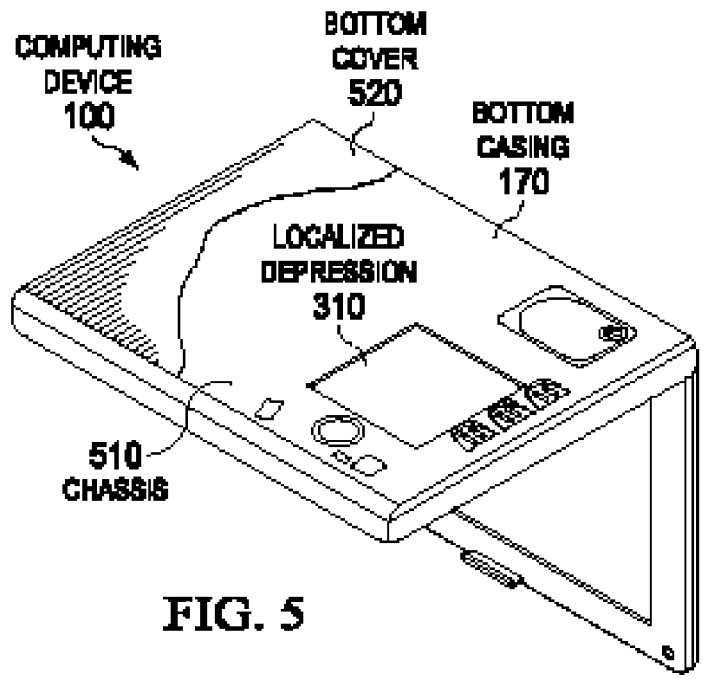
FIG. 5 is a cutaway bottom perspective view of a computing device according to one or more examples of the present Specification.

FIG. 5 is a bottom perspective view of computing device 100 according to one or more examples of the present Specification. In the example of FIG. 5, an additional option for placement of localized depression 310 is disclosed. In this example, localized depression 310 is formed within a chassis portion 510 of bottom casing 170. Notably, chassis 510 may not be visible to an end user of computing device 100. Rather, a bottom cover 520 may be provided to present a substantially uniform plane to an end user. This may enable computing device 100, for example, to rest on a level working surface without rocking or otherwise being disturbed. This provides enhanced ability. However, by using bottom cover 520 in conjunction with localized depression 310, localized depression 310 may be formed either on a top surface or a bottom surface of chassis 510, while still presenting the end user with a substantially uniform bottom casing 170. This provides additional flexibility system design.

Figure 6A:
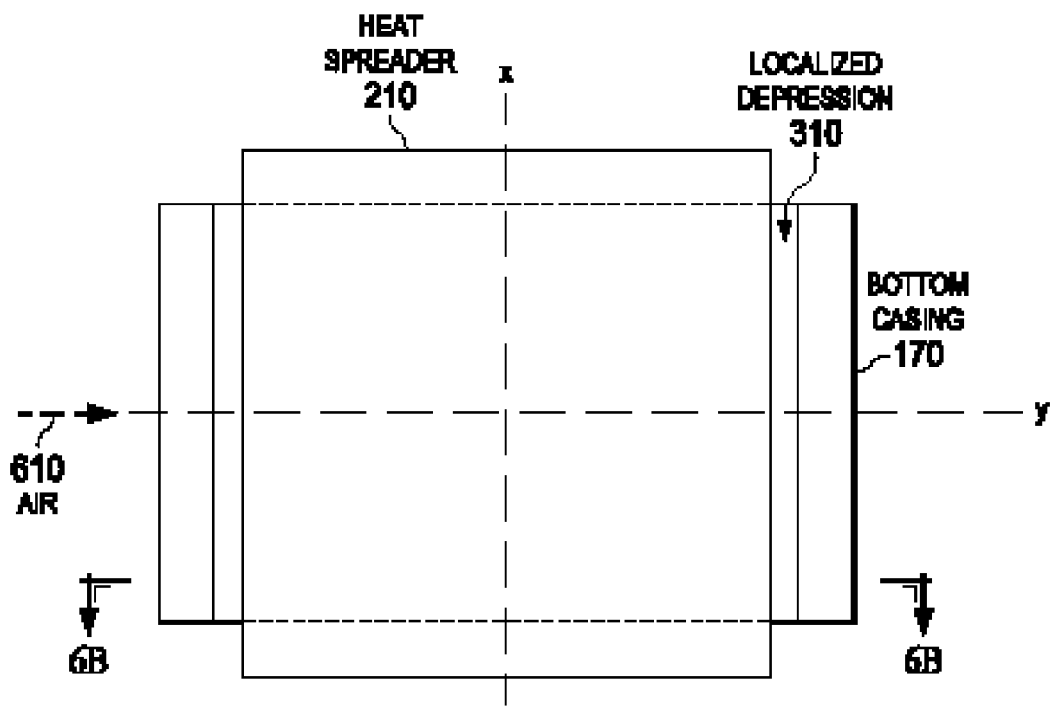
FIG. 6A is a detailed top view of selected components of a computing device according to one or more examples of the present Specification.
Figure 6B:
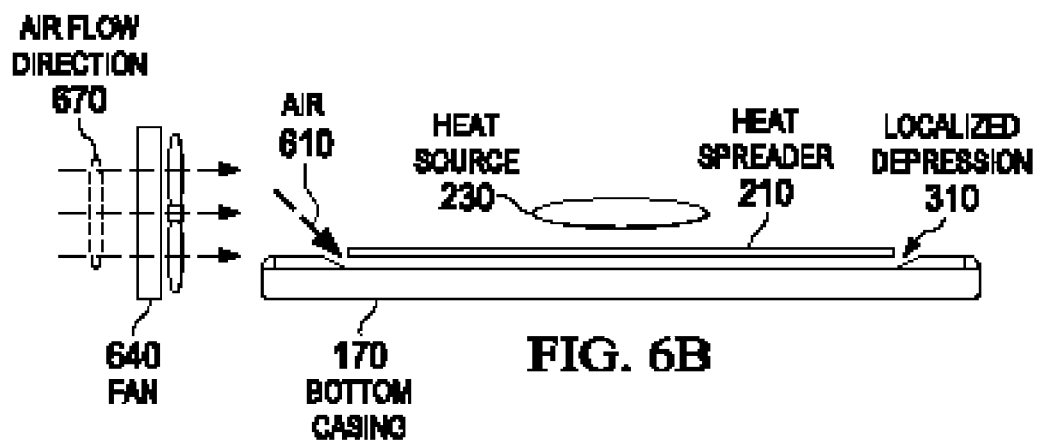
FIG. 6B is a detailed side view of selected components of a computing device according to one or more examples of the present Specification.

FIGS. 6A and 6B disclose yet another embodiment of a portion of computing device 100 according to one or more examples of the present Specification. FIGS. 6A and 6B present a detailed view of localized depression 310. As can be seen in this example, localized depression 310 may be disposed substantially under heat source 230. This enables the air gap between heat source 230 and bottom casing 170 around hot spot 180 to be enlarged, so that the bottom casing 170 skin temperature at hot spot 180 can be lowered with the increased air gap. As with the embodiment of FIG. 4, the input embodiment of FIGS. 6A and 6B provides a heat spreader 210 to help more evenly distribute heat from heat source 230. However, whereas the embodiment of 410 discloses heat spreader 210 substantially enclosing localized depression 310. However, it is possible in certain embodiments for a localized vacuum to be created in localized depression 310. In this example, heat spreader 210 may be disposed above localized depression 310 such that air 610 may flow substantially downward into localized depression 310 on one side and out the other side. This may provide additional cooling and heat distribution. This may be accomplished, for example, by providing a heat spreader 210 that is slightly longer than a first dimension along and x-axis of localized depression 310, and at least slightly smaller than a second Y axis of localized depression 310. Those with skill in the art will recognize that there are many other possible arrangements for providing a heat spreader 210 and localized depression 310 combination of FIGS. 6A and 6B. In certain embodiments, a fan 640 may be provided within airflow direction 670 substantially along the Y axis of localized depression 310. This may more effectively impel air through the gaps on either end of localized depression 310.

Figure 7:
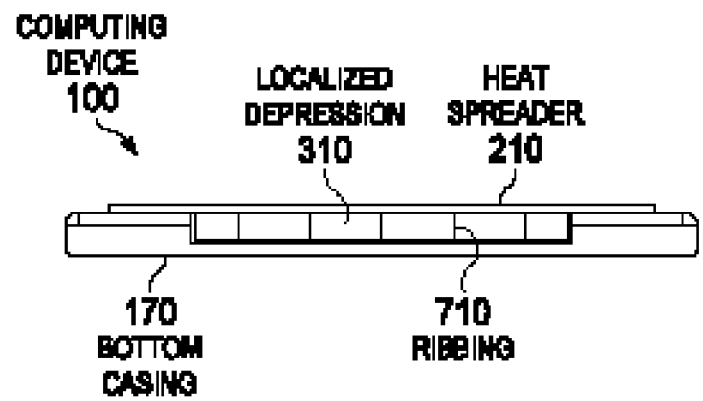
FIG. 7 is a cutaway side view of a computing device according to one or more examples of the present Specification.

FIG. 7 is a cutaway side view of yet another embodiment of computing device 100 according to one or more examples of the present Specification. In the example of FIG. 7, localized depression 310, heat spreader 210, and bottom casing 170 are provided substantially as disclosed herein in other FIGURES. Also visible in this FIGURE is ribbing 710, which may provide additional structural support for heat spreader 210.

Figure 8:
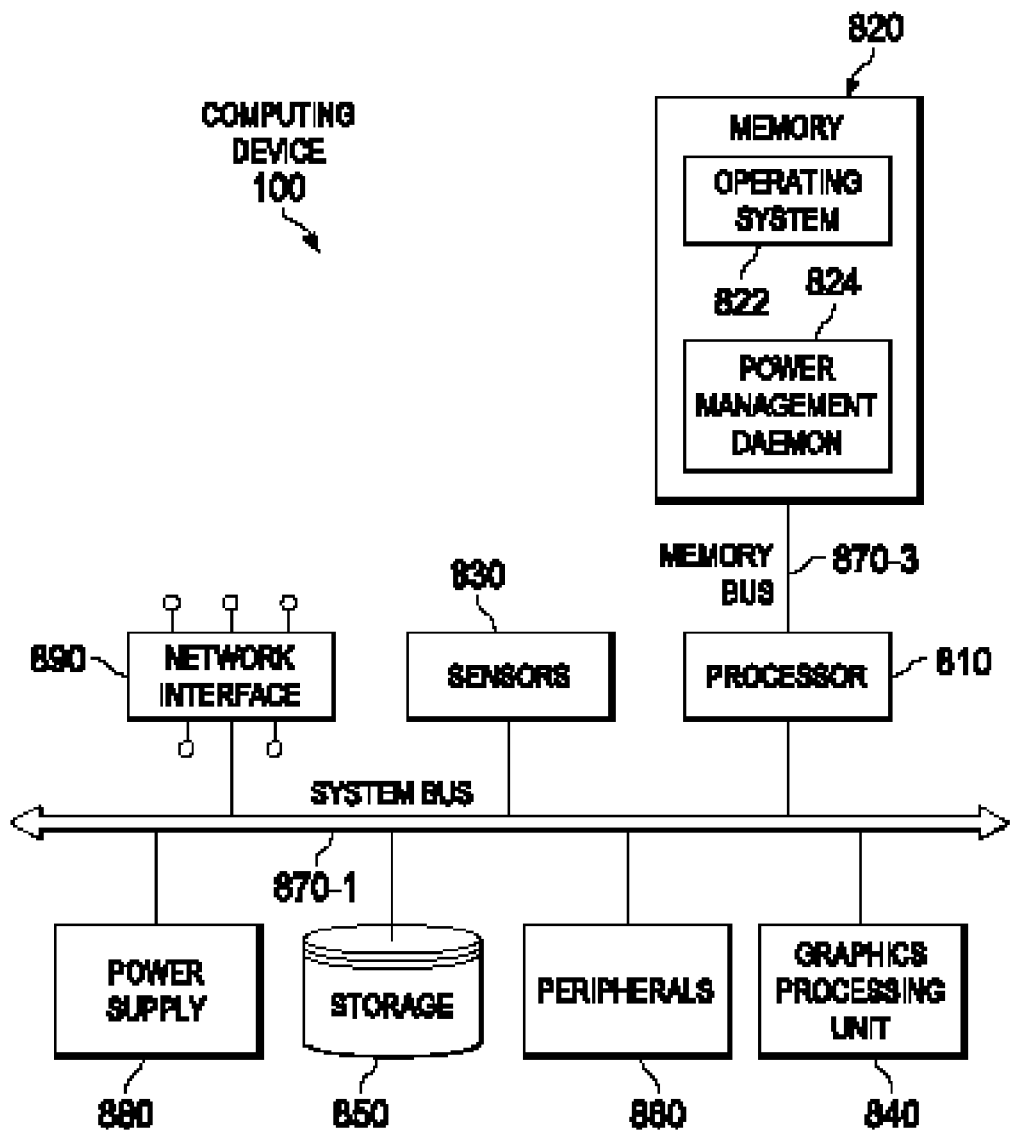
FIG. 8 is a block diagram of a computing device according to one or more examples of the present Specification.

FIG. 8 is a block diagram of computing device 100 according to one or more examples of the present Specification. In various embodiments, a "computing device" may be or comprise, by way of non-limiting example, a computer, embedded computer, embedded controller, embedded sensor, personal digital assistant (PDA), laptop computer, cellular telephone, IP telephone, smart phone, tablet computer, convertible tablet computer, handheld calculator, or any other electronic, microelectronic, or microelectromechanical device for processing and communicating data.

Computing device 100 includes a processor 810 connected to a memory 820, having stored therein executable instructions for providing a power management daemon 824. Other components of computing device 100 may include, by way of example, a storage 850, peripherals 860, sensors 830, GPU 840, network interface 890, and power supply 880.

In an example, processor 810 is communicatively coupled to memory 820 via memory bus 870-3, which may be for example a direct memory access (DMA) bus. Processor 810 may be communicatively coupled to other devices via a system bus 870-1. As used throughout this Specification, a "bus" includes any wired or wireless interconnection line, network, connection, bundle, single bus, multiple buses, crossbar network, single-stage network, multistage network or other conduction medium operable to carry data, signals, or power between parts of a computing device, or between computing devices. It should be noted that these uses are disclosed by way of non-limiting example only, and that some embodiments may omit one or more of the foregoing buses, while others may employ additional or different buses. Power supply 880 may distribute power to system devices via system bus 870-1, or via a separate power bus.

In various examples, a "processor" may include any combination of hardware, software, or firmware providing programmable logic, including by way of non-limiting example a microprocessor, digital signal processor, field-programmable gate array, programmable logic array, application-specific integrated circuit, or virtual machine processor.

Processor 810 may be connected to memory 820 in a DMA configuration via DMA bus 870-3. To simplify this disclosure, memory 820 is disclosed as a single logical block, but in a physical embodiment may include one or more blocks of any suitable volatile or non-volatile memory technology or technologies, including for example DDR RAM, SRAM, DRAM, cache, L1 or L8 memory, on-chip memory, registers, flash, ROM, optical media, virtual memory regions, magnetic or tape memory, or similar. In certain embodiments, memory 820 may comprise a relatively low-latency volatile main memory, while storage 850 may comprise a relatively higher-latency non-volatile memory. However, memory 820 and storage 850 need not be physically separate devices, and in some examples may represent simply a logical separation of function. It should also be noted that although DMA is disclosed by way of non-limiting example, DMA is not the only protocol consistent with this Specification, and that other memory architectures are available.

GPU 840 may be any suitable type of processing element for providing graphics processing and for driving a display adapter.

Storage 850 may be any species of memory 820, or may be a separate device, such as a hard drive, solid-state drive, external storage, redundant array of independent disks (RAID), network-attached storage, optical storage, tape drive, backup system, cloud storage, or any combination of the foregoing. Storage 850 may be, or may include therein, a database or databases or data stored in other configurations, and may include a stored copy of operational software such as an operating system and a copy of power management daemon 824. Many other configurations are also possible, and are intended to be encompassed within the broad scope of this Specification.

Sensors 830 may provide a number of transducers for assessing the state and health of computing device 100. In some embodiments, sensors 830 may include temperature sensors, which may be used for example to determine when it is necessary to operate fan 640 of FIG. 6A. Operational testing of computing device 100 may include operating processor 810 and GPU 840, and then using sensors 832 measure heat output and to identify one or more hot spots 180. Data gathered from such a process may be used to improve future designs of computing device 100.

Operating system 822 may provide services and interfaces for user space programs to access low-level hardware services, and may also operate background processes and other useful utilities. In one example, power management daemon 824 is a utility or program operating under operating system 822 that continuously monitors sensors 830, including heat sensors, to assess the presence of hot spots 180. A "daemon" may include any program or series of executable instructions, whether implemented in hardware, software, firmware, or any combination thereof, that runs as a background process, a terminate-and-stay-resident program, a service, system extension, control panel, bootup procedure, BIOS subroutine, or any similar program that operates without direct user interaction. It should also be noted that power management daemon 824 is provided by way of non-limiting example only, and that other software, including interactive or user-mode software, may also be provided in conjunction with, in addition to, or instead of power management daemon 824 to perform methods according to this Specification. Outputs from power management daemon 824 may be used to iteratively improve designs for computing device 100 over time.

In one example, power management daemon 824 includes executable instructions stored on a non-transitory medium operable to perform methods according to this Specification. At an appropriate time, such as upon booting computing device 100 or upon a command from the operating system or a user, processor 810 may retrieve a copy of power management daemon 824 from storage 850 and load it into memory 820. Processor 810 may then iteratively execute the instructions of power management daemon 824.

Peripherals 860 include any auxiliary device that connects to computing device 100 but that is not necessarily a part of the core architecture of computing device 100. A peripheral may be operable to provide extended functionality to computing device 100, and may or may not be wholly dependent on computing device 100. In some cases, a peripheral may be a computing device in its own right. Peripherals may include input and output devices such as displays, terminals, printers, keyboards, mice, modems, network controllers, sensors, transducers, actuators, controllers, data acquisition buses, cameras, microphones, speakers, or external storage by way of non-limiting example.

In certain embodiments of the present Specification, processor 810, GPU 840, and power supply 880 may be of particular concern for creating hot spots 180. Thus, a system designer may need to pay particular attention to these elements and their placement, for example within casing 150 to ensure proper heat dissipation. Other elements, such as network interface 890, peripherals 860, storage 850, and memory 820 may also be of concern in creating hot spots, although in some embodiments, they generate less heat than processor 810, power supply 880, and GPU 840.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The particular embodiments of the present disclosure may readily include a system on chip (SOC) central processing unit (CPU) package. An SOC represents an integrated circuit (IC) that integrates components of a computer or other electronic system into a single chip. It may contain digital, analog, mixed-signal, and radio frequency functions: all of which may be provided on a single chip substrate. Other embodiments may include a multi-chip-module (MCM), with a plurality of chips located within a single electronic package and configured to interact closely with each other through the electronic package. In various other embodiments, the digital signal processing functionalities may be implemented in one or more silicon cores in Application Specific Integrated Circuits (ASICs), Field Programmable Gate Arrays (FPGAs), and other semiconductor chips.

In example implementations, at least some portions of the processing activities outlined herein may also be implemented in software. In some embodiments, one or more of these features may be implemented in hardware provided external to the elements of the disclosed FIGURES, or consolidated in any appropriate manner to achieve the intended functionality. The various components may include software (or reciprocating software) that can coordinate in order to achieve the operations as outlined herein. In still other embodiments, these elements may include any suitable algorithms, hardware, software, components, modules, interfaces, or objects that facilitate the operations thereof.

Additionally, some of the components associated with described microprocessors may be removed, or otherwise consolidated. In a general sense, the arrangements depicted in the FIGURES may be more logical in their representations, whereas a physical architecture may include various permutations, combinations, and/or hybrids of these elements. It is imperative to note that countless possible design configurations can be used to achieve the operational objectives outlined herein. Accordingly, the associated infrastructure has a myriad of substitute arrangements, design choices, device possibilities, hardware configurations, software implementations, equipment options, etc.

Any suitably-configured processor component can execute any type of instructions associated with the data to achieve the operations detailed herein. Any processor disclosed herein could transform an element or an article (for example, data) from one state or thing to another state or thing. In another example, some activities outlined herein may be implemented with fixed logic or programmable logic (for example, software and/or computer instructions executed by a processor) and the elements identified herein could be some type of a programmable processor, programmable digital logic (for example, an FPGA), an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof. In operation, processors may store information in any suitable type of non-transitory storage medium (for example, random access memory (RAM), read only memory (ROM), FPGA, EPROM, EEPROM, etc.), software, hardware, or in any other suitable component, device, element, or object where appropriate and based on particular needs. Further, the information being tracked, sent, received, or stored in a processor could be provided in any database, register, table, cache, queue, control list, or storage structure, based on particular needs and implementations, all of which could be referenced in any suitable timeframe. Any of the memory items discussed herein should be construed as being encompassed within the broad term 'memory.' Similarly, any of the potential processing elements, modules, and machines described herein should be construed as being encompassed within the broad term 'microprocessor' or 'processor.' Furthermore, in various embodiments, the processors, memories, network cards, buses, storage devices, related peripherals, and other hardware elements described herein may be realized by a processor, memory, and other related devices configured by software or firmware to emulate or virtualize the functions of those hardware elements.

Computer program logic implementing all or part of the functionality described herein is embodied in various forms, including, but in no way limited to, a source code form, a computer executable form, and various intermediate forms (for example, forms generated by an assembler, compiler, linker, or locator). In an example, source code includes a series of computer program instructions implemented in various programming languages, such as an object code, an assembly language, or a high-level language such as OpenCL, Fortran, C, C++, JAVA, or HTML for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

In the discussions of the embodiments above, graphics elements, interconnect boards, clocks, DDRs, sensors, processors, and/or other components can readily be replaced, substituted, or otherwise modified in order to accommodate particular circuitry needs. Moreover, it should be noted that the use of complementary electronic devices, hardware, non-transitory software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In another example embodiment, the electrical circuits of the FIGURES may be implemented as stand-alone modules (e.g., a device with associated components and circuitry configured to perform a specific application or function) or implemented as plug-in modules into application specific hardware of electronic devices.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "steps for" are specifically used in the particular claims; and (b) does not intend, by any statement in the specification, to limit this disclosure in any way that is not otherwise reflected in the appended claims.

Example Embodiment Implementations

There is disclosed in example 1, an apparatus, comprising:
 a casing for receiving a computing device, having a localized depression disposed to be proximate to a heat source of the computing device, the localized depression having a thickness less than a predominant thickness of the casing; and
 a heat spreader disposed above the localized depression.

There is disclosed in example 2, the apparatus of example 1, wherein the heat spreader is a graphite sheet.

There is disclosed in example 3, the apparatus of example 1, wherein the heat spreader is disposed to substantially block air flow through the localized depression.

There is disclosed in example 4, the apparatus of example 1, wherein the heat spreader is disposed to substantially permit air flow through the localized depression.

There is disclosed in example 5, the apparatus of example 4, wherein the heat spreader has a dimension along a first axis greater than a dimension of the localized depression along the first axis, and a dimension along a second axis less than a dimension of the localized depression along the second axis.

There is disclosed in example 6, the apparatus of example 5, further comprising a fan with an airflow direction substantially along the second axis for impelling air into a gap between the heat spreader and the localized depression.

There is disclosed in example 7, the apparatus of example 1, further comprising ribbing disposed to structurally support the heat spreader.

There is disclosed in example 8, a system, comprising:
 a computing device comprising one or more active elements operative to act as a heat source; and
 a casing for the computing device having disposed therein a localized depression proximate to the heat source, the localized depression having a thickness less than a predominant thickness of the casing; and
 a heat spreader disposed over the localized depression.

There is disclosed in example 9, the system of example 8, wherein the heat spreader is a graphite sheet.

There is disclosed in example 10, the system of example 8, wherein the heat spreader is disposed to substantially block air flow through the localized depression.

There is disclosed in example 11, the system of example 8, wherein the heat spreader is disposed to substantially permit air flow through the localized depression.

There is disclosed in example 12, the system of example 11, wherein the heat spreader has a dimension along a first axis greater than a dimension of the localized depression along the first axis, and a dimension along a second axis less than a dimension of the localized depression along the second axis.

There is disclosed in example 13, the system of example 12, further comprising a fan with an airflow direction substantially along the second axis for impelling air into a gap between the heat spreader and the localized depression.

There is disclosed in example 14, the system of example 8, further comprising ribbing disposed to structurally support the heat spreader.

There is disclosed in example 15, a device, comprising:
an operative assembly that, when operating, generates a hot spot; and
a heat dissipation assembly having a localized depression disposed to be proximate to the heat source of the operative assembly, the localized depression having a thickness less than a predominant thickness of the casing, and a heat spreader disposed above the localized depression.

There is disclosed in example 16, the device of example 15, wherein the heat spreader is a graphite sheet.

There is disclosed in example 17, the device of example 15, wherein the heat spreader is disposed to substantially block air flow through the localized depression.

There is disclosed in example 18, the device of example 15, wherein the heat spreader is disposed to substantially permit air flow through the localized depression.

There is disclosed in example 19, the device of example 18, wherein the heat spreader has a dimension along a first axis greater than a dimension of the localized depression along the first axis, and a dimension along a second axis less than a dimension of the localized depression along the second axis.

There is disclosed in example 20, the device of example 19, further comprising a fan with an airflow direction substantially along the second axis and disposed to impel air into a gap between the heat spreader and the localized depression.

There is disclosed in example 21, the device of example 15, further comprising ribbing disposed to structurally support the heat spreader.

What is claimed is:

1. An apparatus, comprising:
   a casing for receiving a computing device, having a localized depression disposed to be proximate to a heat source of the computing device, the localized depression having a thickness less than a predominant thickness of the casing; and a heat spreader disposed above the localized depression;
   wherein the heat spreader has a dimension along a first axis greater than a dimension of the localized depression along the first axis, and a dimension along a second axis less than a dimension of the localized depression along the second axis.

2. The apparatus of claim 1, wherein the heat spreader is a graphite sheet or a metallic foil.

3. The apparatus of claim 1, wherein the heat spreader is disposed to substantially block air flow through the localized depression.

4. The apparatus of claim 1, wherein the heat spreader is disposed to substantially permit air flow through the localized depression.

5. The apparatus of claim 4, further comprising a fan with an airflow direction substantially along the second axis for impelling air into a gap between the heat spreader and the localized depression.

6. The apparatus of claim 1, further comprising ribbing disposed to structurally support the heat spreader.

7. A system, comprising:
   a casing having a localized depression disposed to be proximate to a heat source, the localized depression having a thickness less than a predominant thickness of the casing; and
   a heat spreader disposed above the localized depression;
   wherein the heat spreader has a dimension along a first axis greater than a dimension of the localized depression along the first axis, and a dimension along a second axis less than a dimension of the localized depression along the second axis.

8. The system of claim 7, wherein the heat spreader is a graphite or a metallic foil.

9. The system of claim 7, wherein the heat spreader is disposed to substantially block air flow through the localized depression.

10. The system of claim 7, wherein the heat spreader is disposed to substantially permit air flow through the localized depression.

11. The system of claim 10, further comprising a fan with an airflow direction substantially along the second axis for impelling air into a gap between the heat spreader and the localized depression.

12. The system of claim 7, further comprising ribbing disposed to structurally support the heat spreader.

13. A system, comprising:
    a heat source; and
    a casing including a localized depression disposed to be proximate to the heat source, the localized depression having a thickness less than a predominant thickness of the casing; and
    a heat spreader disposed above the localized depression;
    wherein the heat spreader has a dimension along a first axis greater than a dimension of the localized depression along the first axis, and a dimension along a second axis less than a dimension of the localized depression along the second axis.

14. The device of claim 13, wherein the heat spreader is a graphite sheet or metallic foil.

15. The system of claim 13, wherein the heat spreader is disposed to substantially block air flow through the localized depression.

16. The system of claim 13, wherein the heat spreader is disposed to substantially permit air flow through the localized depression.

17. The system of claim 16, further comprising a fan with an airflow direction substantially along the second axis and disposed to impel air into a gap between the heat spreader and the localized depression.

18. The system of claim 13, further comprising ribbing disposed to structurally support the heat spreader.

* * * * *

UNITED STATES PATENT AND TRADEMARK OFFICE
CERTIFICATE OF CORRECTION

PATENT NO. : 9,952,638 B2  
APPLICATION NO. : 15/119017  
DATED : April 24, 2018  
INVENTOR(S) : Shaorong Zhou et al.

It is certified that error appears in the above-identified patent and that said Letters Patent is hereby corrected as shown below:

In the Claims

In Column 12, Line 42, in Claim 14, delete "device" and insert -- system --, therefor.

Signed and Sealed this
Fourteenth Day of August, 2018

Andrei Iancu
*Director of the United States Patent and Trademark Office*